(12) United States Patent
Akahori et al.

(10) Patent No.: US 6,949,829 B2
(45) Date of Patent: Sep. 27, 2005

(54) SEMICONDUCTOR DEVICE AND FABRICATION METHOD THEREFOR

(75) Inventors: Takashi Akahori, Tsukui-gun (JP); Gishi Chung, Nirasaki (JP); Kohei Kawamura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/380,038

(22) PCT Filed: Sep. 11, 2001

(86) PCT No.: PCT/JP01/07880

§ 371 (c)(1),
(2), (4) Date: Sep. 12, 2003

(87) PCT Pub. No.: WO02/23625

PCT Pub. Date: Mar. 21, 2002

(65) Prior Publication Data

US 2004/0041266 A1 Mar. 4, 2004

(30) Foreign Application Priority Data

Sep. 11, 2000 (JP) ........................................ 2000-274426
Sep. 11, 2000 (JP) ........................................ 2000-274427

(51) Int. Cl.[7] ...................... H01L 23/48; H01L 21/4763
(52) U.S. Cl. ....................... 257/758; 257/759; 257/760; 438/622; 438/623; 438/624
(58) Field of Search ................................ 257/758, 759, 257/760; 438/622–624

(56) References Cited

U.S. PATENT DOCUMENTS

| | | | | |
|---|---|---|---|---|
| 6,054,398 A | * | 4/2000 | Pramanick | ................... 438/784 |
| 6,068,884 A | * | 5/2000 | Rose et al. | |
| 6,291,334 B1 | * | 9/2001 | Somekh | ....................... 438/620 |
| 6,312,874 B1 | * | 11/2001 | Chan et al. | .................. 430/314 |
| 6,448,176 B1 | * | 9/2002 | Grill et al. | ................... 438/637 |
| 6,724,086 B1 | * | 4/2004 | Grill et al. | ................... 257/759 |

FOREIGN PATENT DOCUMENTS

| | | | | |
|---|---|---|---|---|
| EP | 1146555 | * | 10/2001 | |
| JP | 10223758 | * | 8/1998 | ......... H01L/21/283 |
| WO | 99/33102 | * | 7/1999 | |

OTHER PUBLICATIONS

Kow–Ming Chang, et al., "A Novel Pretreatment Technology for Organic Low–Dielectric Material to Suppress Copper Diffusion and Improve Ashing Resistance" Journal of The Electrochemical Society, vol. 147, No. 6, 2000, pp. 2332–2336.*

* cited by examiner

*Primary Examiner*—T. N. Quach
(74) *Attorney, Agent, or Firm*—Crowell & Morin LLP

(57) ABSTRACT

With a stopper layer 19 as an etching stopper, a second groove 14a and a contact hole 13a are formed. Copper is buried inside the second groove 14a and the contact hole 13a, thereby forming a plug layer 22 and an overlying wiring layer 21 connected to an underlying wiring layer 17 via the plug layer 22. The stopper layer 19 is comprised of Si, C and N as essential components. First and second cap layers 18 and 23 are also comprised of Si, C and N as essential components.

40 Claims, 13 Drawing Sheets

SEMICONDUCTOR DEVICE AND FABRICATION METHOD THEREFOR

TECHNICAL FIELD

The present invention relates to a highly reliable semiconductor device and a fabrication method for a semiconductor device.

BACKGROUND ART

To acquire a high-performance large scale integrated circuit (LSI), copper has recently been used as a wiring material. As copper has a lower resistance than that of aluminum, a fast circuit is provided. As copper has a high diffusibility, however, copper, if in directly contact with a semiconductor, deteriorates the semiconductor characteristics.

Due to the high diffusibility, unlike aluminum wires, copper wires cannot be formed by an etching process. Therefore, a so-called dual damascene scheme is used as a method of forming copper multilayer wiring without etching.

The following describes steps of fabricating a semiconductor device having copper multilayer wiring using the dual damascene scheme with reference to FIGS. 10A to 10D. First, a cap layer 103 of silicon nitride or the like is formed on a first insulating layer 102 of silicon oxide or the like in which an underlying wiring layer 101 is buried. The underlying wiring layer 101 comprises a conductive layer 104 of copper or the like and a barrier layer 105 of tantalum nitride or the like which encloses the conductive layer 104.

Next, a second insulating layer 106 of silicon oxide or the like is formed on the cap layer 103. The cap layer 103 prevents diffusion of copper to the second insulating layer 106 from the underlying wiring layer 101. Further, a stopper layer 107 of silicon nitride or the like is formed on the second insulating layer 106, and a third insulating layer 108 of silicon oxide or the like is deposited on the stopper layer 107. This provides a resultant structure as shown in FIG. 10A.

Subsequently, as shown in FIG. 10B, a first photoresist pattern 109 is formed on the third insulating layer 108 and a hole 110 with the conductive layer 104 as its bottom is formed by etching. At this time, etching is carried out under the conditions where the second and third insulating layers 106 and 108, the stopper layer 107 and the cap layer 103 are all etched. After etching, the first photoresist pattern 109 is removed by ashing or the like.

Then, as shown in FIG. 10C, a second photoresist pattern 111 is formed on the third insulating layer 108 and selective etching is performed. Here, etching is carried out under the conditions where the third insulating layer 108 is etched while the stopper layer 107 is not etched. That is, the stopper layer 107 serves as an etching stopper.

In etching, a trench hole 112 which overlaps the hole 110 and has the stopper layer 107 as its bottom is formed in the third insulating layer 108. As a result, the trench hole 112 and a contact hole 113 which connects the trench hole 112 to the underlying wiring layer 101 are formed. After etching, the second photoresist pattern 111 is removed by ashing or the like.

Subsequently, a barrier layer 114 of tantalum nitride or the like is formed on the inner walls of the trench hole 112 and the contact hole 113 by CVD or the like. Further, after the trench hole 112 and the contact hole 113 are buried by plating, excess metal layers are removed by CMP. Through the above-described steps, a plug layer 15 and an overlying wiring layer 116 which is connected to the underlying wiring layer 101 via the plug layer 115 are formed as shown in FIG. 10D. By repeating the above-described steps, a multi-level wiring layer having two or more layers can be formed.

The stopper layer 107 and the cap layer 103 exist in the interlayer insulating film in the semiconductor device that is formed by the dual damascene scheme. Normally, the stopper layer 107 and the cap layer 103 are comprised of insulating films of the same material, i.e., they are formed by using the same film deposition apparatus.

The insulating films that constitute the cap layer 103 and the stopper layer 107 can generally be classified into a type which essentially consists of silicon (Si) and nitrogen (N) (hereinafter referred to as SiCN-based film) and a type which essentially consists of Si and carbon (C) (hereinafter referred to as SiC film).

As the insulating films are present in the interlayer insulating film they are demanded of a low dielectric constant. Further, the insulating films are demanded of a high etching selectivity, as the stopper layer, with respect to the interlayer insulating film, and are demanded of a high barrier property against an wiring material (i.e. low metal diffusibility) as the cap layer.

In case where the insulating films are formed of an SiC film, while the dielectric constant of the film is about 5 which is relatively low and a high etching selectivity is obtained with respect to the interlayer insulating film, the barrier property against copper thereof is low. In case where the insulating films are composed of an SiCN-based film, on the other hand, while the barrier property against copper is high, the dielectric constant is about 7 to 8 which is relatively high and the etching selectivity is low. In case where FSG (Fluorinated Silicate Glass) is used for the interlayer insulating film, the SiCN-based film is likely to be damaged by fluorine radicals that are produced at the time of etching.

As apparent from the above, the insulating films that constitute the conventional stopper layer and/or cap layer did not fully satisfy all of a low dielectric constant, a high etching selectivity with respect to the interlayer insulating film and a barrier property for the wiring material, and it was hard to provide a sufficiently reliable semiconductor device.

DISCLOSURE OF INVENTION

It is therefore an object of the invention to provide a highly reliable semiconductor device and a fabrication method therefor.

It is another object of the invention to provide a semiconductor device which includes an insulating film having a low dielectric constant, a high etching selectivity with respect to an interlayer insulating film and a barrier property for a wiring material, and a fabrication method for the semiconductor device.

To achieve the objects, according to the first aspect of the invention, there is provided a semiconductor device which comprises a first insulating layer which has, on one surface thereof, a groove or a hole reaching an other surface side; a second insulating layer which is provided on said first insulating layer, has an opening overlapping said groove or hole and is comprised of Si, C and N as essential components; and a conductive layer buried inside said groove or hole and said opening.

According to the second aspect of the invention, there is provided a fabrication method for a semiconductor device which comprises the steps of forming a first insulating layer, forming a second insulating layer containing Si, C and N as essential components on said first insulating layer, selectively etching said second insulating layer to form an opening; etching said first insulating layer using said opening as a mask, thereby forming an wrong groove or hole; and burying a conductive layer inside said opening or said wiring groove or hole.

BEST MODE FOR CARRYING OUT THE INVENTION

First Embodiment

A semiconductor device according to one embodiment of the invention is described below with reference to the accompanying drawings.

Figure 1:
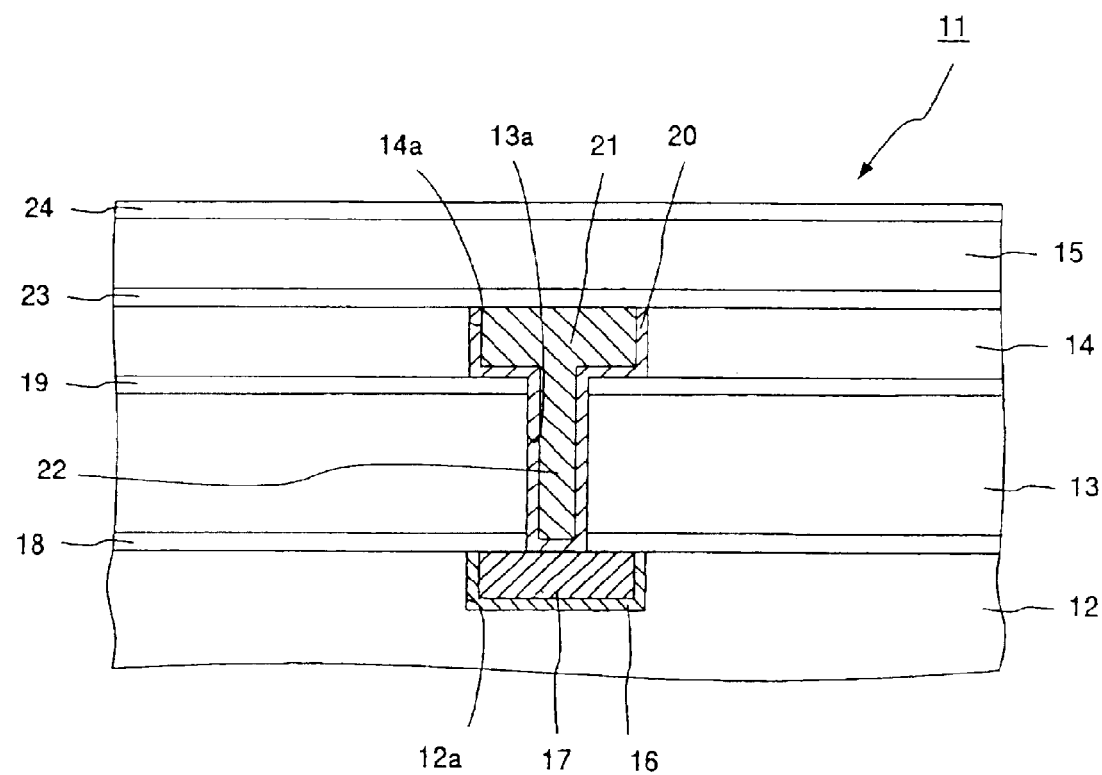
FIG. 1 shows a partial cross section of a semiconductor device according to a first embodiment.

FIG. 1 is a partial cross-sectional view showing the structure of a semiconductor device according to the embodiment. This semiconductor device has elements, such as a memory and transistors, formed on a silicon substrate, and a multi-level wiring layer formed on an interlayer insulating film which covers the elements. FIG. 1 shows a two-level wiring layer near the surface of the semiconductor device.

As shown in FIG. 1, a semiconductor device 11 has a first insulating layer 12, a second insulating layer 13, a third insulating layer 14 and a passivation film 15.

The first insulating layer 12 is comprised of silicon fluoride oxide (SiOF) and is formed, for example, 0.8 µm thick. The first insulating layer 12 has a first groove 12a. An underlying wiring layer 17 of copper is buried in the first groove 12a via a first barrier film 16. The first barrier film 16 has capabilities to prevent diffusion of copper outside the first groove 12a and enhance the adhesion between the first insulating layer 12 and the underlying wiring layer 17. The first barrier film 16 is comprised of a multilayer of a high melting-point metal, such as Ta/TaN, W/WN or Ti/TiN, or an alloy thereof.

A first cap layer 18 is formed, for example, 50 nm thick on the surface of the first insulating layer 12. The first cap layer 18 prevents copper of the underlying wiring layer 17 from being diffused into the second insulating layer 13. The first cap layer 18 is comprised of a film which essentially consists of silicon (Si), carbon (C) and nitrogen (N) (hereinafter referred to as SiCN-based film).

The second insulating layer 13 is provided on the first cap layer 18. The second insulating layer 13, which is comprised of SiOF, is formed, for example, 0.8 µm thick.

A stopper layer 19 is formed, for example, 50 nm thick on the second insulating layer 13. The stopper layer 19 serves as an etching stopper in the fabrication process for the semiconductor device 11 which will be discussed later. The stopper layer 19 is formed of substantially the same SiCN-based film as that of the first cap layer 18.

A contact hole 13a, which penetrates through the second insulating layer 13, the first cap layer 18 and the stopper layer 19, is formed in the second insulating layer 13. The contact hole 13a is formed in such a way as to overlap the first groove 12a.

The third insulating layer 14 is provided on the stopper layer 19. The third insulating layer 14, which is comprised of SiOF, is formed, for example, 0.8 µm thick. Formed in the third insulating layer 14 is a second groove 14a, which penetrates the third insulating layer 14 and has the stopper layer 19 as its bottom. The second groove 14a is formed in such a way as to overlap the contact hole 13a The first groove 12a and the second groove 14a are connected by the contact hole 13a.

Copper as a wiring material is buried in the second groove 14a and the contact hole 13a via a second barrier film 20. The second barrier film 20 has substantially the same composition as the first barrier film 16 and prevents copper diffusion.

The copper that is buried in the second groove 14a forms an overlying wiring layer 21. The copper that is buried in the contact hole 13a forms a plug layer 22 which connects the underlying wiring layer 17 to the overlying wiring layer 21.

A second cap layer 23 is formed, for example, 50 nm thick on the second insulating layer 13 in such a way as to cover the top surface of the overlying wiring layer 21. The second cap layer 23 prevents copper diffusion above the overlying wiring layer 21.

The passivation film 15 is formed, for example, 0.8 µm thick on the second cap layer 23. The passivation film 15 is comprised of a silicon fluoride oxide film A protective film 24, which is comprised of a silicon oxide film, a silicon nitride oxide film or the like, is formed, for example, 50 nm thick on the passivation film 15.

As mentioned above, the SiCN-based film according to the first embodiment, which forms the first and second cap layers 18 and 23 and the stopper layer 19, essentially consists of Si, C and N. Specifically, the ratio of the quantity of C atoms in the film to the quantity of Si atoms (C/Si) ranges from 0.2 to 0.8, and the ratio of the quantity of N atoms to the quantity of Si atoms (N/Si) ranges from 0.15 to 1.0.

The SiCN-based film which has the above-described composition has a dielectric constant of about 5 to 55. This is lower than the dielectric constant (about 7) of the film that essentially consists of Si and N (hereinafter referred to as SiN-based film) but is approximately the same as the dielectric constant (about 5) of the film that essentially consists of Si and C (SiC-based film).

The following describes a fabrication method for the semiconductor device 11 having the above-described structure with reference to the drawings. In the first embodiment, the semiconductor device 11 is fabricated by using the dual damascene scheme. FIG. 2A to FIG. 2H illustrate fabrication steps for the semiconductor device in order.

First, a semiconductor substrate 10 having the first insulating layer 12 in which the underlying wiring layer 17 is formed is prepared. Then, the first cap layer 18 is formed, for example, 50 nm thick on the first insulating layer 12 including the underlying wiring layer 17. The first cap layer 18, which is comprised of an SiCN-based film, is formed by chemical vapor deposition (CVD) which uses an electron cyclotron resonance (ECR) plasma. A mixed gas of, for example, $SiH_4/C_2H_4/N_2/Ar$ (flow rate (sccm): 10/5/25/100 to 10/25/5/100) is used in film deposition.

Figure 2A:
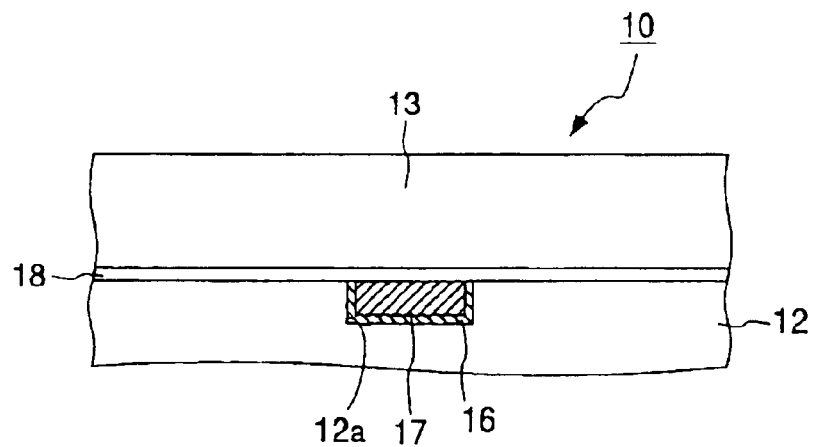
FIGS. 2A to 2H illustrate fabrication steps for the semiconductor device shown in FIG. 1.

Further, the second insulating layer 13 of SiOF is formed, for example, 0.8 μm thick on the first cap layer 18. Film deposition is carried out by ECR plasma CVD using a mixed gas of, for example, $SiH_4/SiF_4/O_2/Ar$ (flow rate (sccm): 50/50/200/100). This yields a resultant structure as shown in FIG. 2A.

Figure 2B:
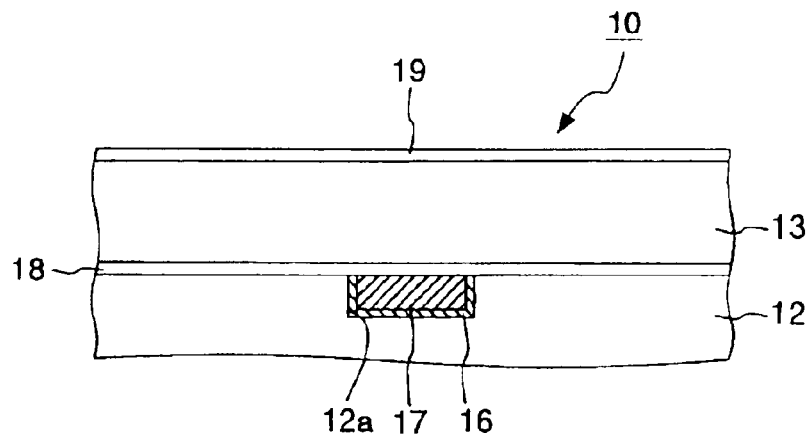

Then, as shown in FIG. 2B, the stopper layer 19, comprised of an SiCN-based film, is formed, for example, 50 nm thick on the second insulating layer 13. Film deposition is carried out by ECR plasma CVD using a mixed gas of, for example, $SiH_4/C_2H_4/N_2/Ar$ (flow rate (sccm): 10/5/25/100 to 10/25/5/100).

Figure 2C:
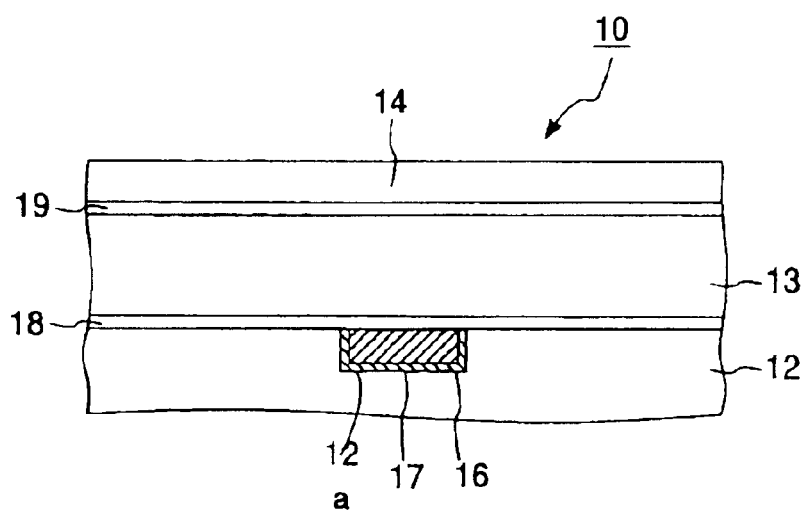

Subsequently, as shown in FIG. 2C, the third insulating layer 14 14 of SiOF is formed, for example, 0.8 μm thick on the stopper layer 19. For example, film deposition is carried out by ECR plasma CVD using a mixed gas of $SiH_4/SiF_4/O_2/Ar$ (flow rate (sccm): 50/50/200/100).

Figure 2D:
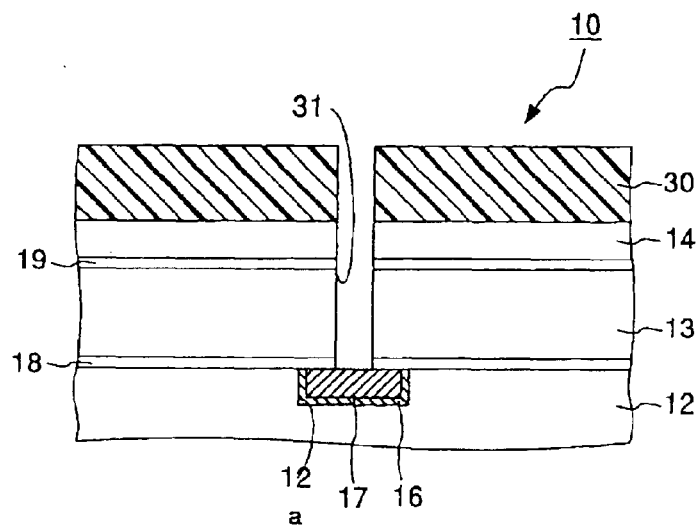

Then, a first photoresist pattern 30 is formed on the third insulating layer 14 by using photolithography technique. Next, etching is performed with the first photoresist pattern 30 as a mask. This forms a hole 31, which penetrates the second insulating layer 13, the third insulating layer 14 and so forth and has the underlying wiring layer 17 as its bottom, as shown in FIG. 2D. Here, etching is executed by reactive ion etching (RIE) using a mixed gas plasma of, for example, $O_2$ and $CF_4$. Accordingly, an SiOF film (the second insulating layer 13 and the third insulating layer 14) and an SiCN-based film (the first cap layer 18 and the stopper layer 19) are etched simultaneously. Thereafter, the first photoresist pattern 30 is removed by ashing.

Figure 2E:
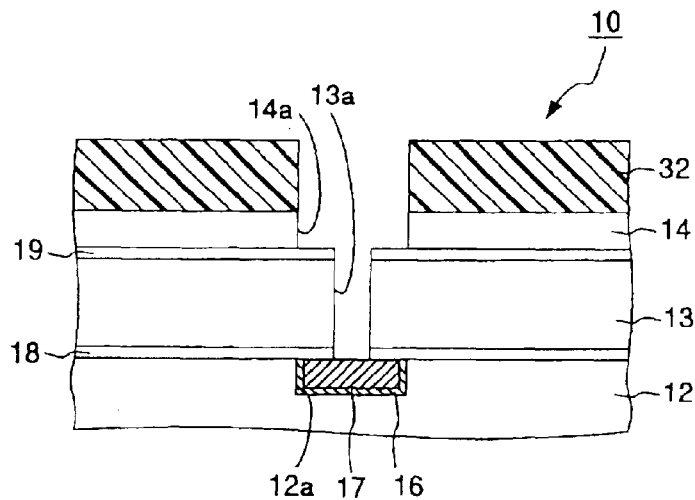

Subsequently, a second photoresist pattern 32 is formed on the third insulating layer 14 by using the photolithography technique. Next, etching is performed with the second photoresist pattern 32 as a mask. The etching is carried out under the conditions where while the SiOF film (the third insulating layer 14) is etched, the SiCN-based film (the stopper layer 19) is not etched. The etching is executed by RIE using a mixed gas plasma of, for example, $C_4F_8$ and CO. Accordingly, the second groove 14a whose bottom is the stopper layer 19 and the contact hole 13a which extends from the second groove 14a to the underlying wiring layer 17 are formed, as shown in FIG. 2E.

Figure 2F:
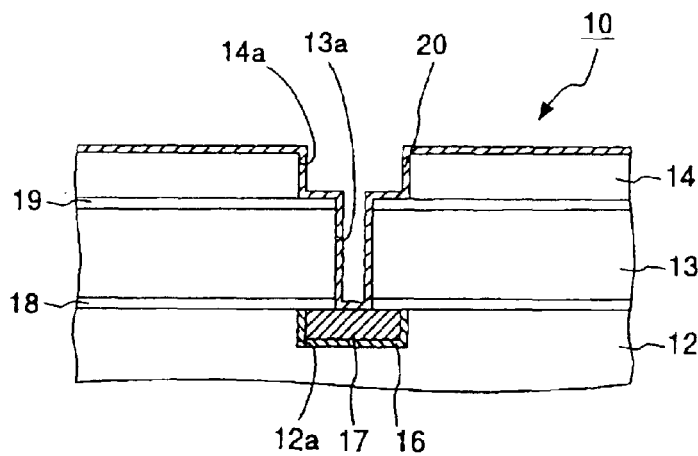

Subsequently, as shown in FIG. 2F, the second barrier film 20 is formed on the entire inner walls of the second groove 14a and the contact hole 13a by sputtering or the like. The second barrier film 20 is, for example, a TaN and Ta deposited film (Ta/TaN).

Figure 2G:
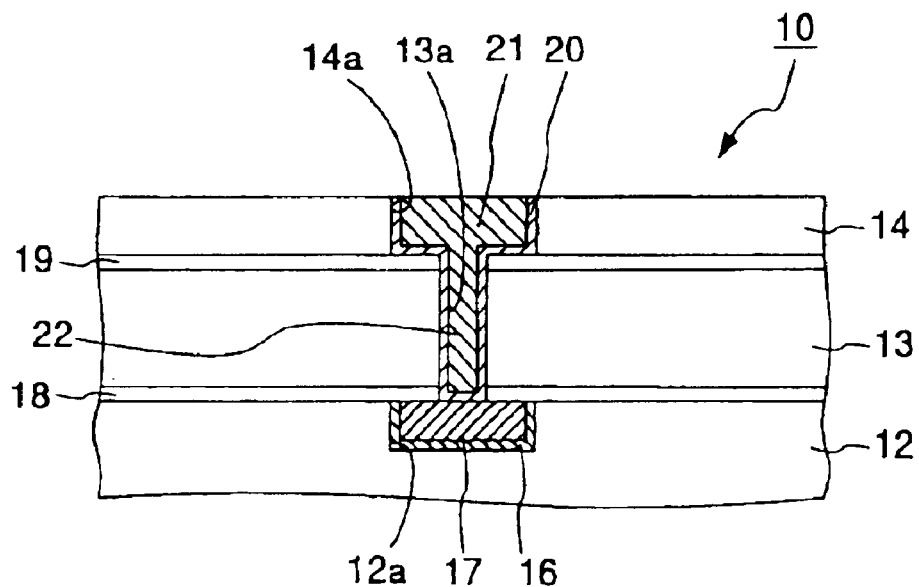

Then, after a seed layer of copper is formed on the entire surface of the semiconductor substrate 10 by sputtering or the like, copper plating is performed. As a result, the interiors of the second groove 14a and the contact hole 13a are buried with copper. Then, the excess metal layers on the surface of the semiconductor substrate 10 are removed by chemical mechanical polishing (CMP). As a result, the overlying wiring layer 21 and the plug layer 22 as shown in FIG. 2G are formed.

Further, the second cap layer 23 comprised of an SiCN-based film is formed, for example, 50 nm thick on the third insulting layer 14 including the overlying wiring layer 21. The second cap layer 23 is deposited in the same way as the first cap layer 18.

Further, the passivation film 15 of, for example, SiOF is formed, for example, 0.8 μm thick on the second cap layer 23 by ECR plasma CVD.

Figure 2H:
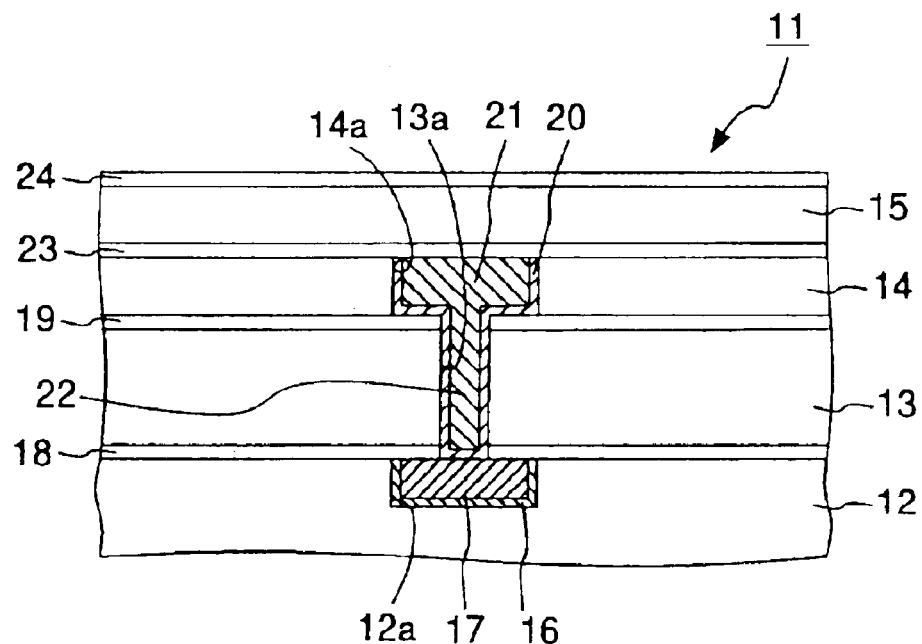

Finally, the protective film 24 of silicon oxide is formed 50 nm thick. As a result, the semiconductor device 11 as shown in FIG. 2H is acquired Here, the second cap layer 23, the passivation film 15 and the protective film 24 are deposited by the same ECR plasma CVD apparatus. This completes the fabrication process.

EXAMPLES

Figure 3:
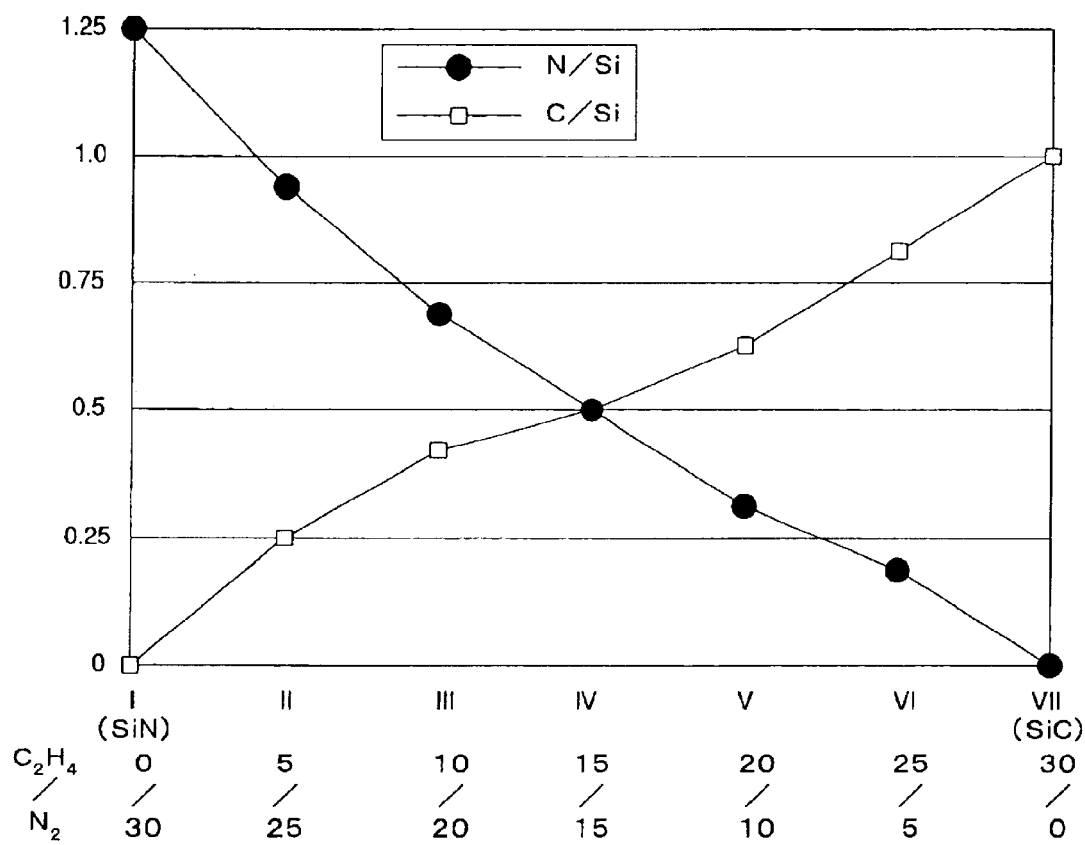
FIG. 3 shows the compositions of an SiCN-based film according to the first embodiment.

In the example of the fabrication process, the SiCN-based film is formed by ECR plasma CVD using a mixed gas of $SiH_4/C_2H_4/N_2/Ar$ (flow rate (sccm): 10/5/25/100 to 10/25/5/100). FIG. 3 shows the ratio of the quantity of C atoms in the SiCN-based film to the quantity of Si atoms (C/Si) and the ratio of the quantity of N atoms to the quantity of Si atoms (N/Si) when deposition is carried out while the mixing ratio of the $C_2H_4$ gas and the $N_2$ gas is changed with a constant flow rate of $SiH_4$.

The quantities of the Si, C and N atoms in the SiCN-based film were calculated by Rutherford backscattering spectroscopy (RPS).

In FIG. 3, cases I and VII respectively show the results in the case where $N_2$ alone was used and the case where $C_2H_4$ alone was used. Cases II to VI respectively show the results in the cases where, given that the total flow rate of $C_2H_4$ and $N_2$ is 30 sccm, the individual flow rates were changed to 5, 10, 15, 20 and 25.

As apparent from the results of cases II to VI in FIG. 2, the ratio of the C content to the N content in the SiCN-based film varies in accordance with the ratio of the flow rate of $C_2H_4$ to the flow rate of $N_2$. That is, the greater the amount of $C_2H_4$ in the process gas is, the higher the C content (C/Si) in the SiCN-based film to be formed becomes. The greater the amount of $N_2$ becomes, on the other hand, the higher the N content (N/Si) in the SiCN-based film becomes. Of course, the SiN film and the SiC film are respectively formed in cases I and II where only one of $C_2H_4$ and $N_2$ is used.

It is understood that when the flow rates of $C_2H_4$ and $N_2$ are changed between 5/25 to 25/5, N/Si varies within the range of 0.2 (case VI) to 0.9 (case II), and C/Si varies within the range of 0.25 (case II) to 0.8 (case VI).

Figure 4:
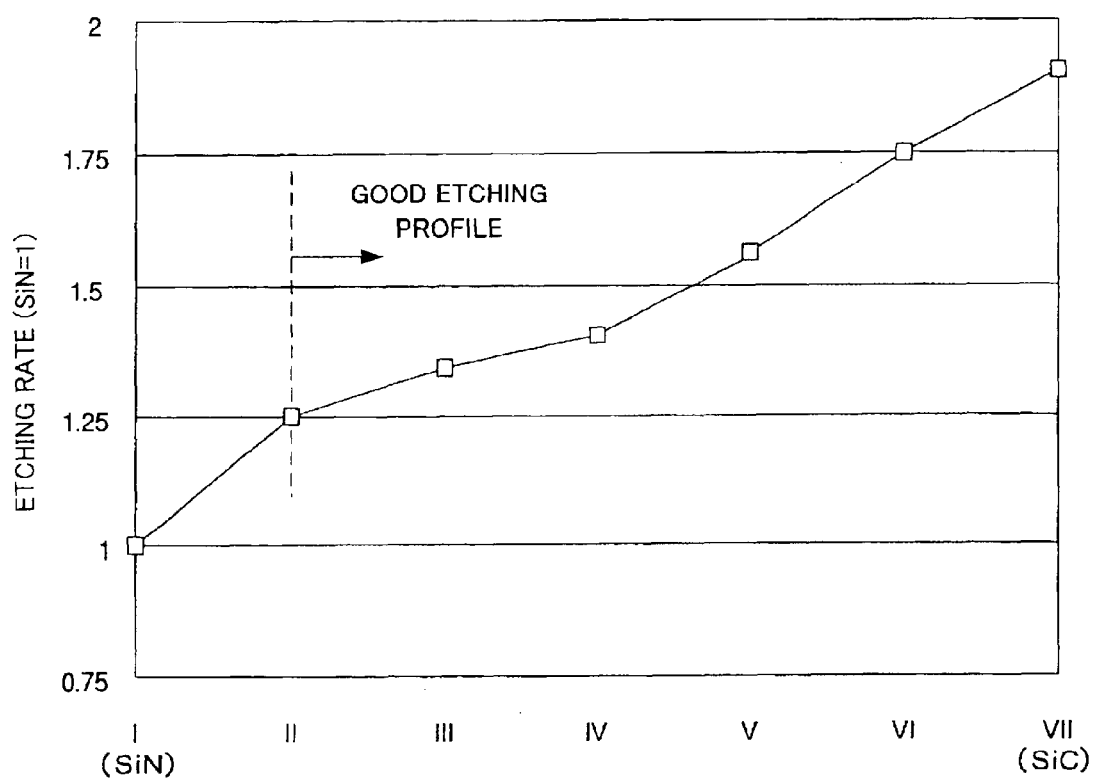
FIG. 4 shows the ratio of the etching rate of the SiCN-based film shown in FIG. 3 to the etching rate of an SiCN-based film.

FIG. 4 shows the results of studying the etching rate for the films with the structures shown in FIG. 3 (cases I to VII). FIG. 4 shows the ratio of the etching rate when the etching rate of the SiN film (case I) is set to 1. An $O_2/CF_4$ plasma gas was used in etching.

As apparent from FIG. 4, the etching rate of the SiC film (case VII) is equal to or greater than double that of the SiN film. It is apparent that the SiCN-based film shows an intermediate etching rate between those of the SiC film and the SiN film, and a higher etching rate is acquired as the C content in the film increases.

In case where the SiOF film is used as an interlayer insulating film and the SiN film (case I) is used as an etching stopper, the etching selectivity is low and a good etching shape is not obtained. In case of the SiCN-based film (cases II to VI) whose C/Si is equal to or greater than 0.2 or at least 0.25 or above, however, the etching rate is high and a high etching selectivity to the SiOF film is obtained, so that a good etching profile is obtained. It is seen from FIG. 3 that when N/Si is equal to or smaller than 1 or at least 0.9 or below, a high barrier property is acquired.

The barrier property of the SiCN-based film (cases II to VI) that is formed in the above-described manner against the wiring material, particularly, the barrier property against copper was studied. Copper has the highest diffusibility among wiring materials which are generally used. Note that studies were also made on the SiN film (case I) and the SiC film (case VII).

Figure 5:
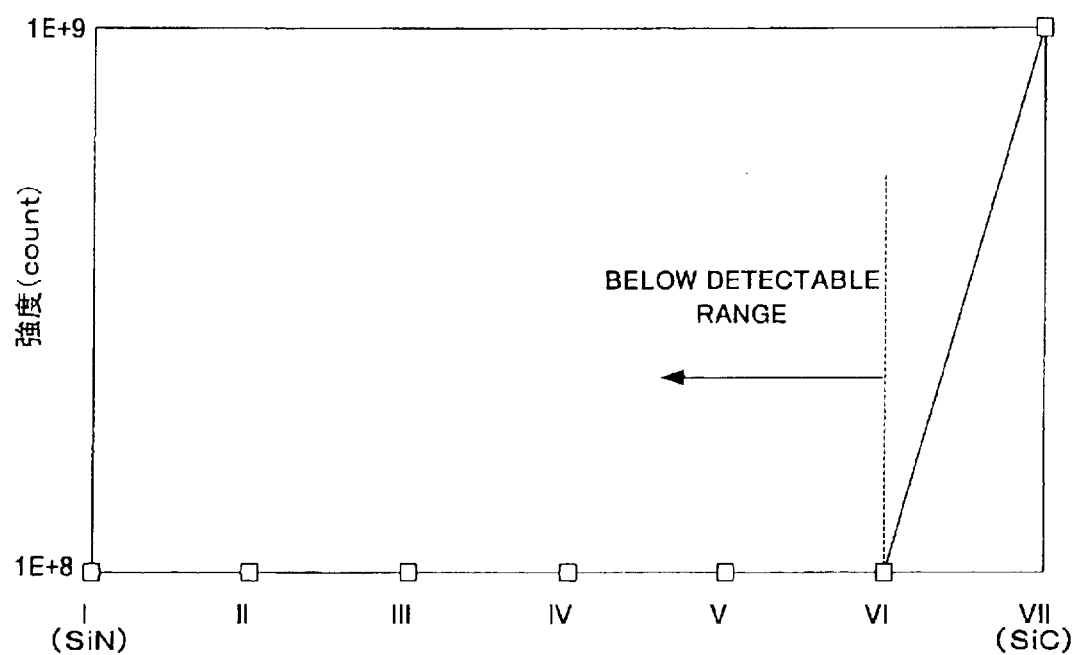
FIG. 5 shows the results of studying the barrier property of the SiCN-based film shown in FIG. 3 with respect to copper by using SIMS.

Specifically, the barrier property was studied as follows. First, an SiCN-based film is deposited on the silicon substrate and further a copper layer is formed 0.2 $\mu$m thick. Then, the silicon substrate is held at 450° C. for seven hours. For the silicon substrate after the heat treatment, the SIMS (Secondary Ion Mass Spectroscopy) strength of copper in the vicinity of the interface between the silicon substrate and the SiCN-based film was studied. Generally, if diffusion of copper to the silicon substrate is not detected by the SIMS under the above-described conditions, it is considered that there is no problem in the usage of the device. FIG. 5 shows the results.

It is seen from FIG. 5 that, for the SiC film (case VII), copper is detected near the interface and the barrier property of the SiC film against copper is low. For the SiN film (case I) and the SiCN-based film (cases II to VI), however, copper is not detected and a high barrier property against copper is shown This shows that the higher the N content in the film gets (the lower the C content is), the higher the barrier property gets. Further, it is understood that when the ratio of N to Si (N/Si) in the film is 0.15 or greater or at least 0.2 or above, a high barrier property is obtained so that diffusion of the wiring material such as copper, can be prevented. Referring to FIG. 3, it is understood that when C/Si is 0.85 or greater or at least 0.8 or above, a high barrier property is obtained.

It is understood from the results shown in FIGS. 4 and 5 that the SiCN-based film whose C/Si is 0.2 or greater or at least 0.25 or above (N/Si is 1 or smaller or at least 0.9 or smaller and whose N/Si is 0.15 or greater or at least 0.2 or greater (C/Si is 0.85 or greater or at least 0.8 or above) has a low dielectric constant and has an excellent etching selectivity and a high barrier property. It is therefore apparent that the SiCN-based film in the first embodiment which has such compositions that C/Si is 0.2 to 0.8 and N/Si is 0.15 to 1.0 has a low dielectric constant, an excellent etching selectivity and a high barrier property, and is suitable as an etching stopper and a cap film.

Second Embodiment

A semiconductor device 11 according to the second embodiment of the invention has the same structure as that of the first embodiment shown in FIG. 1 and has an insulating film comprised of an SiCN-based film. The SiCN-based film in the second embodiment contains $10^{21}$ to $10^{22}$ $CH_n$ groups (n being an integer of 1 to 3), i.e., CH groups, $CH_2$ groups and $CH_3$ groups, per volume area.

The SiCN-based film in the second embodiment is formed by using various kinds of starting materials including at least one of Si, $CH_n$ groups and N as an essential element. For example, monosilane ($SiH_4$), ethylene ($C_2H_4$) and nitrogen ($N_2$) can be used as starting materials. Further, an organic silicon material containing $CH_n$ groups (e.g., methylated silane, silazane material and a N-containing material (e.g., $N_2$, $NH_3$) can be used as starting materials. Furthermore, a material containing Si, $CH_n$ groups and N, for example, methylated silane, can be used alone.

The SiCN-based film is formed in such a way as to contain a predetermined number ($10^{21}$ to $10^{22}$ groups/cm$^3$) of $CH_n$ groups in the film. The quantity of $CH_n$ groups can be adjusted by changing the mixing ratio or the like of the starting materials.

Figure 6:
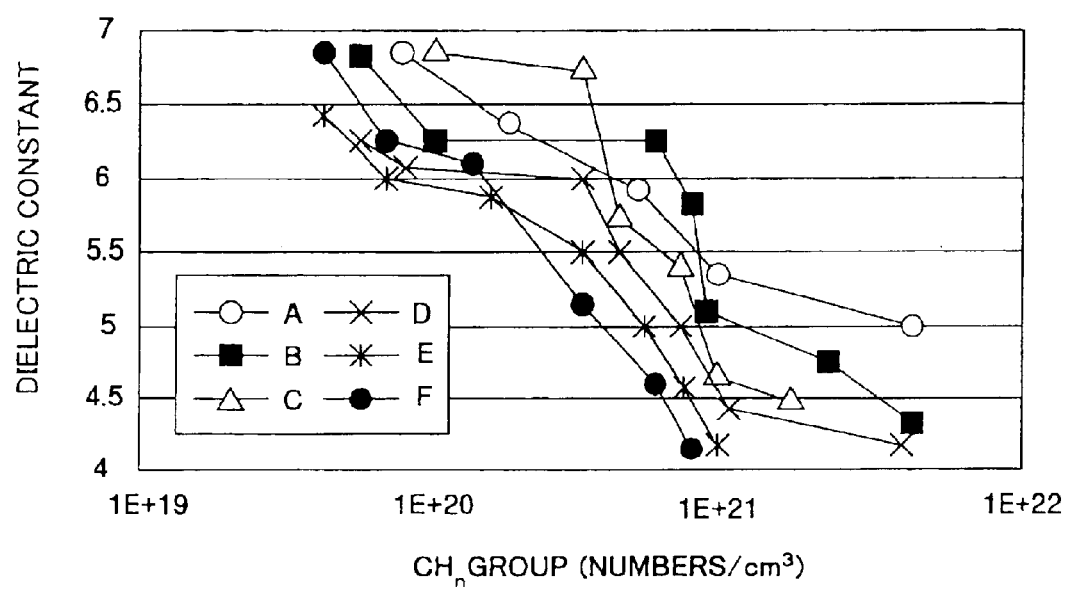
FIG. 6 illustrates the relationship between the number of $CH_n$ groups and the dielectric constant of an SiCN-based film according to a second embodiment.

FIG. 6 illustrates the relationship between the number of $CH_n$ groups per unit volume (groups/cm$^3$) in the SiCN-based film formed of various staring materials and the dielectric constant. 1a FIG. 6, the SiCN-based films that were formed by using the following mixed gases A to F are checked. Here, the quantity of $CH_n$ bonding was measured in the direction of the film depth by an X-ray photoelectron spectroscopy (XPS).

A: silane ($SiH_4$)/$C_2H_4$/$N_2$/Ar
B: trimethylsilane ($SiH(CH_3)_3$)/$N_2$/Ar
C: trimethylsilane/$NH_3$/Ar
D: hexamethylcyclotrisilazne (($Si(CH_3)_2$—$NH)_3$)/Ar
E: hexamethylcyclotrisilazne (($Si(CH_3)_2$—$NH)_3$)/$N_2$/Ar
F: hexamethylcyclotrisilazne/$NH_3$/Ar It is understood from FIG. 6 that in any one of the A to F cases, an SiCN-based insulating film having a low dielectric constant can be obtained by increasing the quantity of $CH_n$ groups. When $SiH_4$, $C_2H_4$ and $N_2$ are used (A), for example, the dielectric constant of the film drops from about 6.8 to 5 as the quantity of $CH_n$ groups in the SiCN-based film to be formed is increased from $10^{20}$ (groups/cm$^3$) to less than $10^{22}$ (groups/cm$^3$). When hexamethylcyclotrisilazne and $NH_3$ are used (F), the dielectric constant of the film drops from about 6.8 to 4.2 as the quantity of $CH_n$ groups in the film is increased from $10^{20}$ (groups/cm$^3$) to less than $10^{21}$ (groups/cm$^3$).

It is apparent that the SiCN-based film containing $10^{21}$ (groups/cm$^3$) or larger $CH_n$ groups has a dielectric constant of 6 or less, specifically, 5.5 or less. This shows that the SiCN-based film in the second embodiment which contains $10^{21}$ to $10^{22}$ (groups/cm$^3$) $CH_n$ groups has a dielectric constant of 6 or less. This is lower than the dielectric constant (7 to 8) of the SiN film that is normally used as a stopper film or the like, so that the SiCN-based film can be suitably used as a stopper film or the like.

It is understood that in case where the quantity of $CH_n$ groups in the film is the same but the staring materials differ, the dielectric constant differs. For example, the larger the molecular size of the starting material is, the lower the dielectric constant becomes. That is, a lower dielectric constant is obtained when trimethylsilane ($SiH(CH_3)_3$) is used than when monosilane ($SiH_4$) is used, and a much lower dielectric constant is obtained when hexamethylcyclotrisilazne (($Si(CH_3)_2$—$NH)_3$) is used.

The following describes the barrier property of the SiCN-based film against copper.

Figure 7:
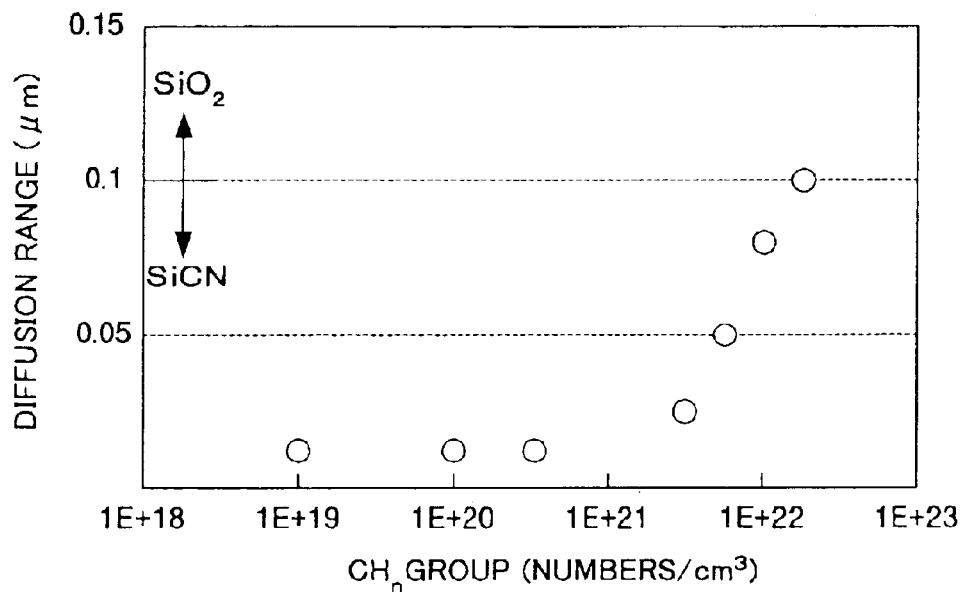
FIG. 7 shows the results of studying the barrier property of the SiCN-based film shown in FIG. 6 with respect to copper by using SIMS.

FIG. 7 shows the relationship between the quantity of $CH_n$ groups in the SiCN-based film and the diffusibility of copper. Copper diffusion was measured by the SIMS (Secondary Ion Mass Spectroscopy). In the measurement, a substrate which has an SiCN-based film (0.05 $\mu$m) and a silicon oxide film (0.1 $\mu$m) deposited in order on a copper layer was used and the substrate was heated at 400° C. for three hours after which the measurement was made by the SIMS.

Figure 8:
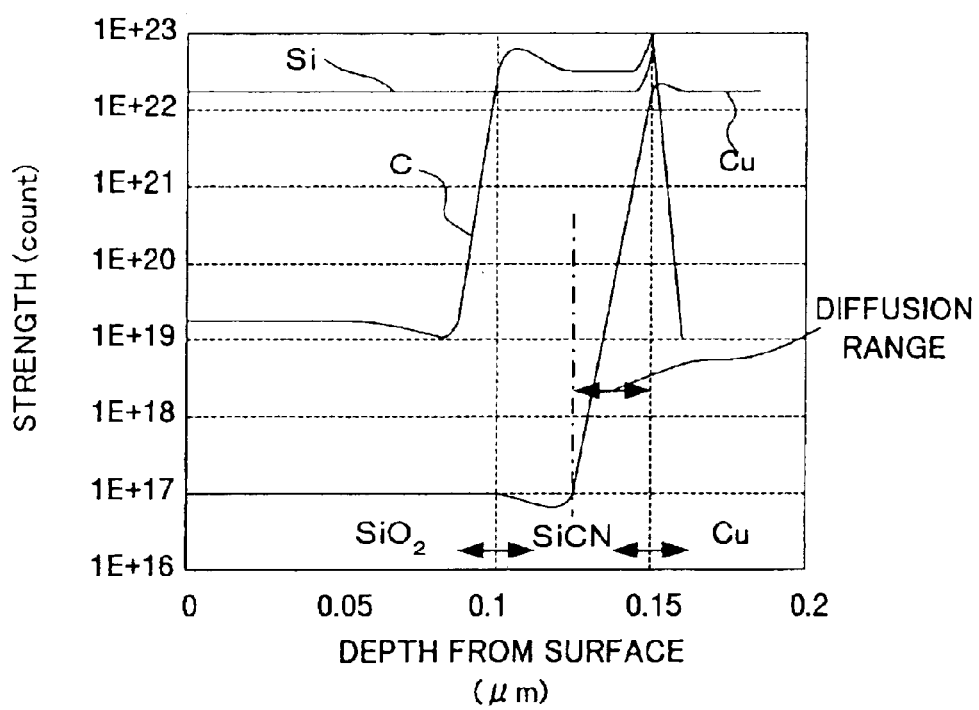
FIG. 8 exemplifies the results of studying the barrier property of an SiCN-based film by using SIMS.

According to the measurement using the SIMS, the results as shown in FIG. 8 are obtained. FIG. 8 shows the SIMS strengths of Si, C and copper and the quantities of the individual atoms at a predetermined depth from the surface. The diffusion range of copper shown in FIG. 7 indicates the diffusion range of copper into the SiCN-based film (to the depth of 0.1 μm to 0.15 μm from the surface) in FIG. 8.

It is apparent from FIG. 7 that when the quantity of $CH_n$ groups per unit volume is about $10^{21}$ (groups/cm$^3$), copper is hardly diffused. It is apparent that when the quantity of $CH_n$ groups is about $10^{21}$ to about $10^{22}$ (groups/cm$^3$), diffusion in the SiCN-based film is seen but diffusion in the silicon oxide film is suppressed. This shows that the SiCN-based film in the second embodiment which contains $10^{21}$ to $10^{22}$ (groups/cm$^3$) $CH_n$ groups has a good barrier property against copper.

The invention is not limited to the above-described embodiments, but can be modified and adapted in various forms. The following describes modifications of the embodiments, which can be adapted to the invention.

In the embodiments, etching of the interlayer insulating film uses a mixed gas of $O_2$ and $CF_4$ and a mixed gas of $C_4F$ and CO. But, they are not restrictive and a plasma gas, such as a mixed gas of $H_2$, Ar and $N_2$, can also be used. Further, for $CF_4$ and $C_4F_8$, other fluorocarbon materials ($C_mF_n$ (m and n being integers of 0 or above) can be used.

In the embodiments, the second cap layer 23, the passivation film 15 and the protective film 24 were deposited by using ECR plasma CVD apparatus. However, this is not restrictive and at least one of those layer and films may be formed in another CVD apparatus or all of them may be formed in separate CVD apparatuses.

In the embodiments, the SiCN based film was formed with $SiH_4$, $C_2H_4$ and $N_2$ as source gas compounds. As illustrated in the second embodiment, however, any source compounds can be used as long as they are compounds containing Si, C and N and the SiCN-based film is formed by a single compound or by the reaction of the proper combination of those compounds.

When three source gas compounds each containing Si, C and N are used, for example, $SiH_4$ is for an Si-containing material, $C_2H_4$, $CH_4$, $C_2H_6$, $C_2H_2$ and so forth have only to be combined properly for a C-containing compound and $N_2$, $NF_3$, $N_2O$, $N_2O_4$, NO, $N_3H_8$ and so forth have only to be combined properly for an N-containing compound.

Two kinds of gases, a source compound containing Si and C and a source compound containing N, may be mixed in film deposition. In this case, the aforementioned compounds are used as the N-containing compound, an organic silane, such as alkylsilane or alkoxylsilane, is used as the compound containing Si and C, and they should be properly combined. As alkylsilane, for example, there is methylated silane, such as methylsilane ($SiH_3(CH_3)$), dimethylsilane ($SiH_2(CH_3)_2$), trimethylsilane ($SiH(CH_3)$) or tetramethylsilane ($Si(CH_3)_4$). As alkoxylsilane, for example, there is methoxylated silane, such as trimethoxymethylsilane ($Si(CH_3)(OCH_3)_3$). To the contrary, a source gas containing Si and N and a source gas containing C may be mixed. In this case, the C-containing compound should be selected from those mentioned above, and as the compound containing Si and N, disilaazane ($SiH_3$—NH—$SiH_3$), for example, may be used, and they should be properly combined.

Further, a compound containing all of Si, C and N can be used as a source gas. As such a compound, an organic silazane compound having silane bonding (—Si—N—) can be used. In case where an organic silazane compound is used, it may be subjected to thermal polymerization to form a film by, for example, plasma CVD. Usable organic silazane compounds are, for example, triethylsilazane ($SiEt_3NH_2$), tripropylsilazane ($SiPr_3NH_2$), triphenylsilazane ($SiPh_3NH_2$), tetramethyldisilazane ($SiMe_2H$—NH—$SiMe_2H$), hexamethyldisilazane ($SiMe_3$—NH—$SiMe_3$), hexaethyldisilazine ($SiEt_3$—NH—$SiEt_3$), hexaphenyldisilazane ($SiPh_3$—NH—$SiPh_3$), heptamethyldisilazane ($SiMe_3$—NMe—$SiMe_3$), dipropyl-tetramethyldisilazane ($SiPrMe_2$—NH—$SiPrMe_2$), di-n-butyl tetramethyldisilazane ($SiBuMe_2$—NH—$SiBuMe_2$), di-n-octyl-tetramethyldisilazane ($SiOcMe_2$—NH—$SiOcMe_2$), triethyl-trimethylcyclotrisilazane (($SiEtH$—$NMe$)$_3$), hexamethylcyclotrisilazane (($SiMe_2$—$NH$)$_3$), hexaethylcyclotrisilazane (($SiEt_2$—$NH$)$_3$), hexaphenylcyclotrisilazane (($SiPh_2$—$NH$)$_3$), octamethylcyclotetrasilazane (($SiMe_2$—$NH$)$_4$), octaethylcyclotetrasilazane (($SiEt_2$—$NH$)$_4$), tetraethyl-tetramethylcyclotetrasilazane (($SiHEt$—$NMe$)$_4$), cyanopropylmethylcyclosilazane ($SiMeNC(CH_2)_3$—NH, tetraphenyldimethyldisilazane ($SiMePh_2$—NH—$SiMePh_2$), dipheyl-tetramethyldisilazane (($SiMe_2Ph$)$_2$—NH), trivinyl-trimethylcyclotrisilazane (($CH_2$=$CH$—$SiMe$—$NH$)$_3$), tetravinyltetramethylcyclotetrasilazane ($CH_2$=$CH$—$SiMe$—$NH$)$_4$, and divinyl-tetramethyldisilazane ($CH_2$=$CH$—$SiMe_2$—$NH$—$SiMe_2$—$CH$=$CH_2$). In those formulae, Me indicates a methyl group ($CH_3$), Et indicates an ethyl group ($CH_5$), Pr indicates a propyl group ($C_3H_7$), Oc indicates an n-octyl group (n-$C_8H_{17}$), and Ph indicates a phenyl group ($C_6H_5$).

Although it is sufficient to have source gases containing Si, C and N, one for each kind, in the above-described example, this is not restrictive. For example, a gas having $N_2$, $C_2H_2$ added to organic silane or a gas having $N_2$ added to organic silazane may be used.

In the embodiments, the stopper layer 19 is provided in interlayer insulating film to form a part of the bottom of the second groove 14a. But, the stopper layer may be formed on the top surface of the interlayer insulating film. FIG. 9A to FIG. 9D show a fabrication process in this case.

Figure 9A:
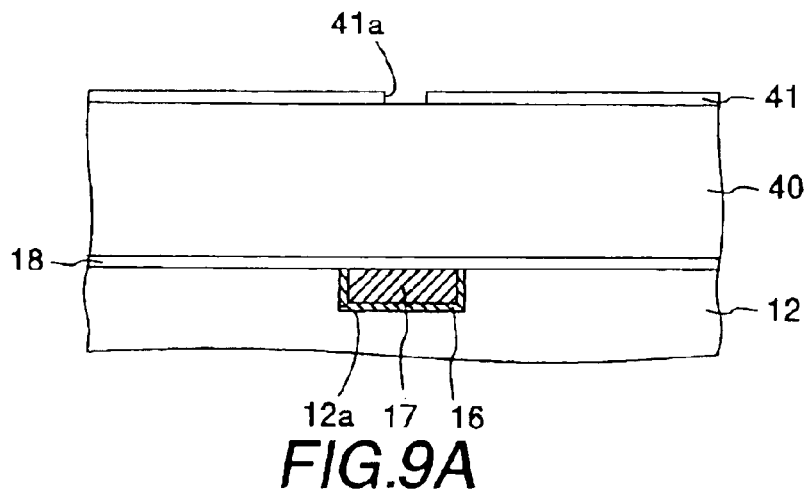
FIGS. 9A to 9E illustrate a modification of the fabrication method of a semiconductor device.
Figure 9B:
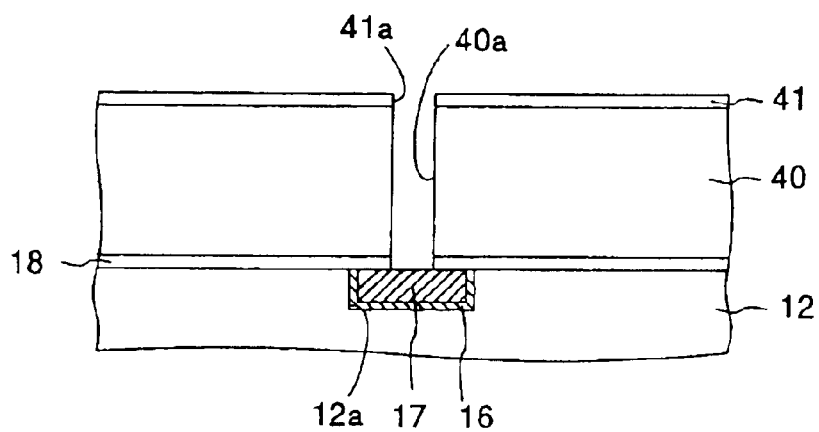

In this case, first, a stopper layer 41 (SiCN-based film) is formed on an interlayer insulating film 40 which has an wiring layer 17 or the like and is covered with the first cap layer 18. Next, a first opening 41a is formed in the stopper layer 41 as shown in FIG. 9A by using the photolithography technique. Subsequently, with the first opening 41a as a mask, the interlayer insulating film 40 is etched, thus forming a hole 40a in the interlayer insulating film 40 as shown in FIG. 9B.

Figure 9C:
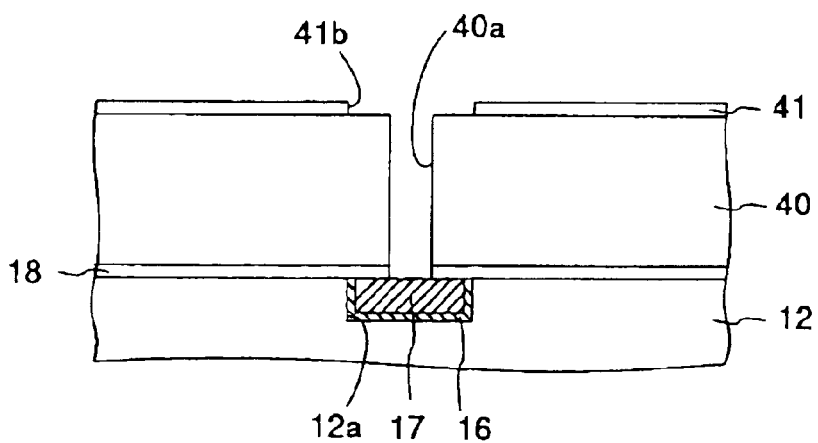
Figure 9D:
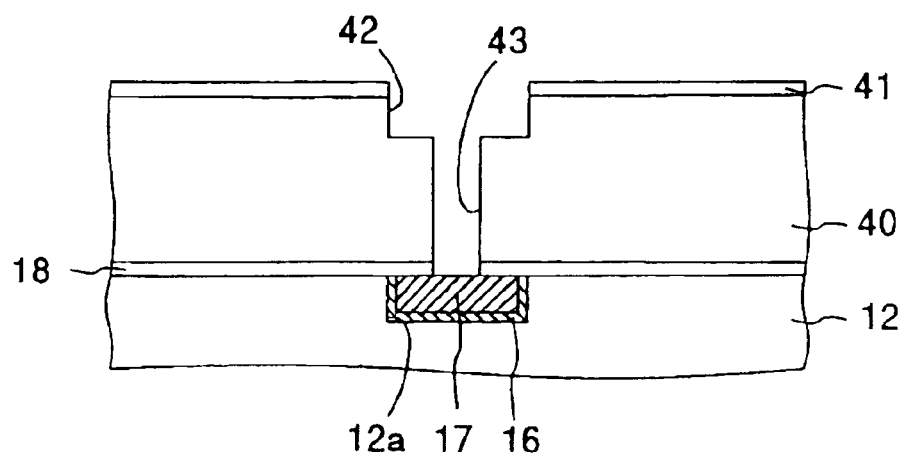
Figure 9E:
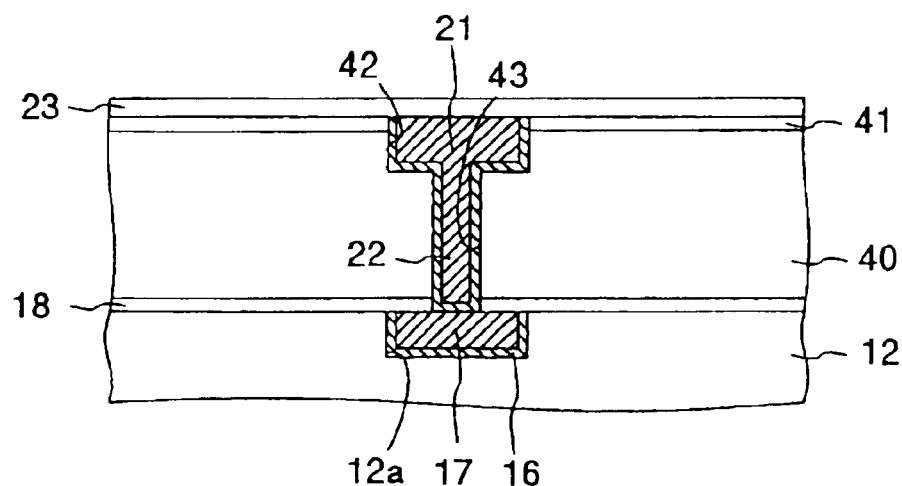
Figure 10A:
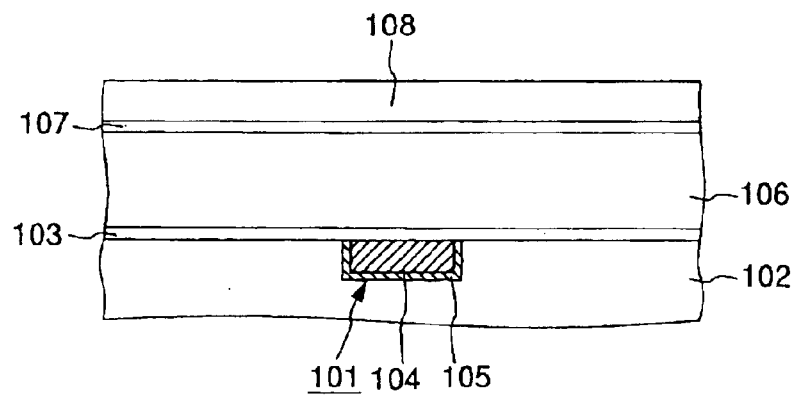
FIGS. 10A through 10D are diagrams for explaining the dual damascene scheme.
Figure 10B:
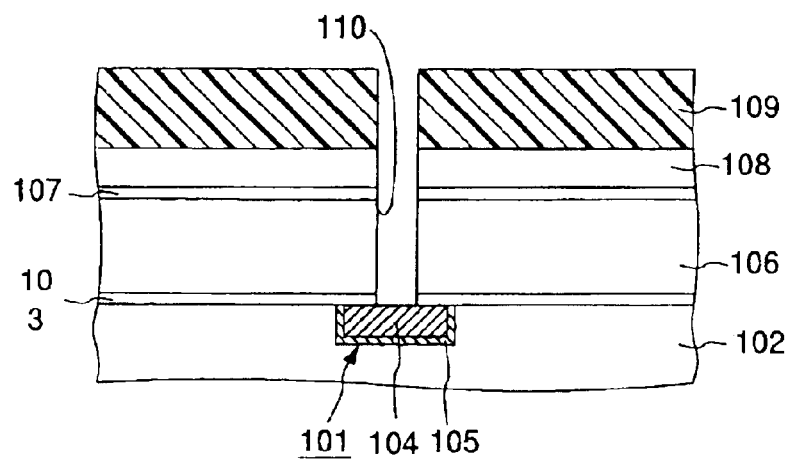
Figure 10C:
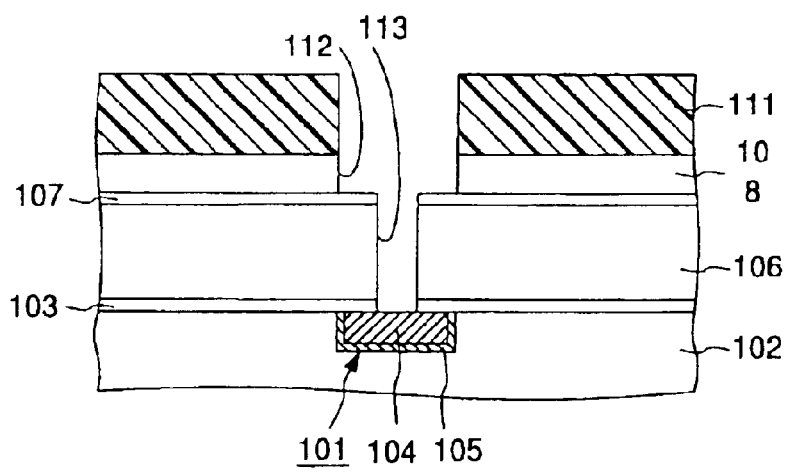
Figure 10D:
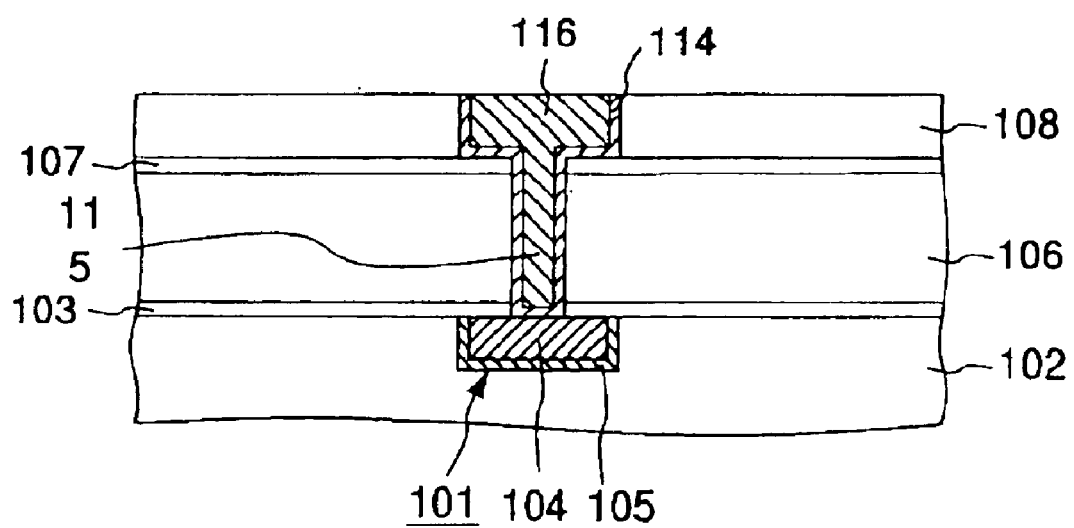

Next, a second opening 41b is formed in the stopper layer 41 as shown in FIG. 9C by using the photolithography technique. Subsequently, with the second opening 41b as a mask, the interlayer insulating film 40 is etched. At this time, etching is stopped in time before the interlayer insulating film 40 is not completely etched. As a result, a trench hole 42 and a contact hole 43 are formed as shown in FIG. 9D. Thereafter, copper burying, the formation of the second cap layer 23 and so forth are executed to provide the semiconductor device 11 as shown in FIG. 9E.

In the embodiments, silicon fluoride oxide is used for the interlayer insulating film. But, the invention can also suitably adapted to a case where a carbon fluoride film is used for the interlayer insulating film. Although the conductive layer that constitutes wiring is formed of copper, it is not limited to copper but aluminum or an alloy thereof or the like may be used.

In the embodiments, the SiCN-based film is deposited by ECR plasma CVD. The film deposition method is not limited to this type, but may be plasma CVD inductive coupled plasma (ICP) CVD, helicon wave plasma CVD, parallel plate plasma CVD or the like.

INDUSTRIAL APPLICABILITY

The invention is useful for fabrication of a highly reliable semiconductor device.

This application is based on Japanese Patent Applications No. H12-274426 filed on Sep. 11$^{th}$, 2000 and No. H12-274427 filed on Sep. 11$^{th}$, 2000, and including specification, claims, drawings and summary. The disclosure of the above Japanese Patent Applications is incorporated herein by reference in its entirety.

What is claimed is:

1. A semiconductor device comprising:
   a first insulating layer which has, on one surface thereof, a groove or a hole reaching another surface side;
   a second insulating layer which is provided on said first insulating layer has an opening overlapping said groove or hole and includes Si, C and N; and
   a conductive layer buried in said groove or hole and said opening,
   wherein a ratio of a quantity of C atoms to a quantity of Si atoms in said second insulating layer is 0.2 to 0.8, and a ratio of a quantity of N atoms to said quantity of Si atoms in said second insulating layer is 0.15 to 1.0.

2. The semiconductor device according to claim 1, further comprising a third insulating layer which is provided on said second insulating layer and is comprised of Si, C and N.

3. The semiconductor device according to claim 2, wherein a ratio of a quantity of C atoms to a quantity of Si atoms in said third insulating layer is 0.2 to 0.8, and a ratio of a quantity of N atoms to said quantity of Si atoms in said third insulating layer is 0.15 to 1.0.

4. The semiconductor device according to claim 1, wherein said first insulating layer is comprised of silicon fluoride oxide or carbon fluoride.

5. The semiconductor device according to claim 1, wherein said conductive layer is comprised of copper.

6. A semiconductor device comprising:
   a first insulating layer having a first through hole;
   a second insulating layer which is provided on said first insulating layer, has a first opening overlapping said first through hole and includes Si, C and N;
   a third insulating layer which is provided on said second insulating layer and has a second through hole overlapping said first opening and larger in diameter than said first opening; and
   a conductive layer buried in said first through hole, said first opening and said second through hole,
   wherein a ratio of a quantity of C atoms to a quantity of Si atoms in said second insulating layer is 0.2 to 0.8, and a ratio of a quantity of N atoms to said quantity of Si atoms in said second insulating layer is 0.15 to 1.0.

7. The semiconductor device according to claim 6, further comprising a fourth insulating layer which is provided on said third insulating layer and said conductive layer and is comprised of Si, C and N.

8. The semiconductor device according to claim 7, wherein a ratio of a quantity of C atoms to a quantity of Si atoms in said fourth insulating layer is 0.2 to 0.8, and a ratio of a quantity of N atoms to said quantity of Si atoms in said fourth insulating layer is 0.15 to 1.0.

9. The semiconductor device according to claim 6, wherein said first insulating layer and said third insulating layer are comprised of silicon fluoride oxide or carbon fluoride.

10. The semiconductor device according to claim 6, wherein said conductive layer is comprised of copper.

11. A semiconductor device comprising:
    a first insulating layer which has, on one surface thereof, a groove or a hole reaching an other surface side;
    a second insulating layer which is provided on said first insulating layer, has an opening overlapping said groove or hole and includes Si, C, N and H; and
    a conductive layer buried inside said groove or hole and said opening,
    said second insulating layer containing $10^{21}$ to $10^{22}$ $CH_n$ groups (n being an integer of 1 to 3) per volume area.

12. The semiconductor device according to claim 11, further comprising a third insulating layer which is provided on said second insulating layer and said conductive layer and includes Si, C, N and H.

13. The semiconductor device according to claim 12, wherein a ratio of a quantity of C atoms to a quantity of Si atoms in said third insulating layer is 0.2 to 0.8, and a ratio of a quantity of N atoms to said quantity of Si atoms in said third insulating layer is 0.15 to 1.0.

14. The semiconductor device according to claim 11, wherein said first insulating layer is comprised of silicon fluoride oxide or carbon fluoride.

15. The semiconductor device according to claim 11, wherein said conductive layer is comprised of copper.

16. The semiconductor device according to claim 11, wherein said second insulating layer has dielectric constant of 6 or less.

17. A semiconductor device comprising:
    a first insulating layer having a first through hole;
    a second insulating layer which is provided on said first insulating layer, has a first opening overlapping said first through hole and includes Si, C, N and H,
    a third insulating layer which is provided on said second insulating layer and has a second through hole overlapping said first opening and larger in diameter than said first opening; and
    a conductive layer buried in said first through hole, said first opening and said second through hole,
    said second insulating layer containing $10^{21}$ to $10^{22}$ $CH_n$ groups (n being an integer of 1 to 3) per volume area.

18. The semiconductor device according to claim 17, further comprising a fourth insulating layer which is provided on said third insulating layer and said conductive layer, includes Si, C and H and contains $10^{21}$ to $10^{22}$$CH_n$ groups (n being an integer of 1 to 3) per volume area.

19. The semiconductor device according to claim 17, wherein said first insulating layer and said third insulating layer are comprised of silicon fluoride oxide or carbon fluoride.

20. The semiconductor device according to claim 17, wherein said conductive layer is comprised of copper.

21. The semiconductor device according to claim 17, wherein said second insulating layer has dielectric constant of 6 or less.

22. A fabrication method for a semiconductor device comprising the steps of:
    forming a first insulating layer;
    forming a second insulating layer including Si, C and N on said first insulating layer;

selectively etching said second insulating layer to form an opening;

etching said first insulating layer using said second insulating layer as a mask, thereby forming a wiring groove or hole; and burying a conductive layer in said opening or said wiring groove or hole;

wherein a ratio of a quantity of C atoms to a quantity of Si atoms in said second insulating layer is 0.2 to 0.8, and a ratio of a quantity of N atoms to said quantity of Si atoms in said second insulating layer is 0.15 to 1.0.

23. The fabrication method according to claim 22, wherein a third insulating layer including Si, C and N is further formed on said second insulating layer and said conductive layer.

24. The fabrication method according to claim 23, wherein a ratio of a quantity of C atoms to a quantity of Si atoms in said third insulating layer is 0.2 to 0.8, and a ratio of a quantity of N atoms to said quantity of Si atoms in said third insulating layer is 0.15 to 1.0.

25. The fabrication method according to claim 22, wherein said first insulating layer is comprised of silicon fluoride oxide or carbon fluoride.

26. The fabrication method according to claim 22, wherein said conductive layer is comprised of copper.

27. A fabrication method for a semiconductor device comprising the steps of:

forming a first insulating layer;

forming a second insulating layer including Si, C and N on said first insulating layer;

forming a third insulating layer on said second insulating layer;

selectively etching to form a first hole which penetrates through said first insulating layer, said second insulating layer and said third insulating layer;

selectively etching said third insulating layer using said second insulating layer as a stopper to form a second hole which overlaps said first hole and is larger in diameter than said first hole; and burying a conductive layer inside said first hole and said second hole, wherein a ratio of a quantity of C atoms to a quantity of Si atoms in said second insulating layer is 0.2 to 0.8, and a ratio of a quantity of N atoms to said quantity of Si atoms in said second insulating layer is 0.15 to 1.0.

28. The fabrication method according to claim 27, wherein a fourth insulating layer including Si, C and N is further formed on said third insulating layer and said conductive layer.

29. The fabrication method according to claim 28, wherein a ratio of a quantity of C atoms to a quantity of Si atoms in said fourth insulating layer is 0.2 to 0.8, and a ratio of a quantity of N atoms to said quantity of Si atoms in said fourth insulating layer is 0.15 to 1.0.

30. The fabrication method according to claim 27, wherein said first insulating layer and said third insulating layer are comprised of silicon fluoride oxide or carbon fluoride.

31. The fabrication method according to claim 27, wherein said conductive layer is comprised of copper.

32. A fabrication method for a semiconductor device comprising the steps of:

forming a first insulating layer;

forming a second insulating layer including Si, C and N on said first insulating layer;

selectively etching said second insulating layer to form an opening;

etching said first insulating layer using said second insulating layer as a mask, thereby forming a wiring groove or hole; and burying a conductive layer inside said opening or said wiring groove or hole, said second insulating layer being formed in said step of forming said second insulating layer in such a way as to contain $10^{21}$ to $10^{22}$ $CH_n$ groups (n being an integer of 1 to 3) per volume area.

33. The fabrication method according to claim 32, wherein in said second insulating layer forming step, said second insulating layer is formed with at least an organic silazane compound as a starting material.

34. The fabrication method according to claim 32, further comprising a step of forming a third insulating layer, which includes Si, C, N and H and contain $10^{21}$ to $10^{22}$ $CH_n$ groups (n being an integer of 1 to 3) per volume area, on said second insulating layer and said conductive layer.

35. The fabrication method according to claim 32, wherein said first insulating layer is comprised of silicon fluoride oxide or carbon fluoride.

36. The fabrication method according to claim 32, wherein said conductive layer is comprised of copper.

37. A fabrication method for a semiconductor device comprising the steps of:

forming a first insulating layer;

forming a second insulating layer including Si, C and N on said first insulating layer;

forming a third insulating layer on said second insulating layer;

selectively etching to form a first hole which penetrates through said first insulating layer, said second insulating layer and said third insulating layer;

selectively etching said third insulating layer using said second insulating layer as a stopper to form a second hole which overlaps said first hole and is larger in diameter than said first hole; and burying a conductive layer in said first hole and said second hole, said second insulating layer being formed in said step of forming said second insulating layer in such a way as to contain $10^{21}$ to $10^{22}$ $CH_n$ groups (n being an integer of 1 to 3) per volume area.

38. The fabrication method according to claim 37, wherein in said second insulating layer forming step, said second insulating layer is formed with at least an organic silazane compound as a starting material.

39. The fabrication method according to claim 37, wherein a fourth insulating layer, which includes Si, C, N and H and contains $10^{21}$ to $10^{22}$ $CH_n$ groups(n being an integer of 1 to 3) per volume area, is further formed on said third insulating layer and said conductive layer.

40. The fabrication method according to claim 37, wherein said first insulating layer and said third insulating layer are comprised of silicon fluoride oxide or carbon fluoride.

* * * * *